United States Patent
Cox et al.

(10) Patent No.: US 6,270,375 B1
(45) Date of Patent: *Aug. 7, 2001

(54) LOW INDUCTANCE FLEX-TO-PCB SPRING CONNECTOR FOR A DISC DRIVE

(75) Inventors: Alvin E. Cox, Yukon; Housan Dakroub; Steven S. Eckerd, both of Oklahoma City, all of OK (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/596,823

(22) Filed: Jun. 19, 2000

Related U.S. Application Data

(63) Continuation of application No. 09/303,202, filed on Apr. 30, 1999, now Pat. No. 6,129,579
(60) Provisional application No. 60/089,347, filed on Jun. 15, 1998, and provisional application No. 60/089,344, filed on Jun. 15, 1998.

(51) Int. Cl.[7] .................................................. H01R 12/24
(52) U.S. Cl. ........................................ 439/493; 360/97.01
(58) Field of Search ..................................... 439/493–496; 360/97.01, 97.03

(56) References Cited

U.S. PATENT DOCUMENTS

| | | |
|---|---|---|
| 3,696,319 | 10/1972 | Olsson . |
| 4,752,244 | 6/1988 | Kuhl et al. . |
| 4,752,246 | 6/1988 | Triner et al. . |
| 4,755,177 | 7/1988 | Young . |
| 4,936,792 | 6/1990 | Onoue et al. . |
| 5,337,202 | 8/1994 | Jabbari et al. . |
| 5,403,202 | 4/1995 | Roehling . |
| 5,541,787 | 7/1996 | Jabbari et al. . |
| 5,717,541 | 2/1998 | Yeas et al. . |
| 5,757,580 | 5/1998 | Andress et al. . |

FOREIGN PATENT DOCUMENTS

WO 98/34296    8/1998   (WO) .

*Primary Examiner*—Paula Bradley
*Assistant Examiner*—Briggitte R. Hammond
(74) *Attorney, Agent, or Firm*—Crowe & Dunlevy

(57) ABSTRACT

A low inductance electrical spring connector for a disc drive interconnecting the conductors of a flex circuit support and seal apparatus to conductive traces on a PCB, the electrical spring connector having a dielectric housing with a plurality of spaced-apart insulator portions, and a plurality of conductive spring contacts disposed between the insulator portions. The dielectric housing forms an open ended insertion cavity disposable below the flex circuit support and seal apparatus. First ends of the conductive spring contacts are solderable to conductive traces on the PCB, while second ends of the conductive spring contacts are contact surfaces disposed in the insertion cavity. Inserting the conductors of the flex circuit adjacent the contact surfaces into the insertion cavity causes the contact surfaces to engage the conductors of the flex circuit to secure the flex circuit support and seal apparatus while providing electrical contact between the head-disc assembly and the printed circuit board.

13 Claims, 4 Drawing Sheets

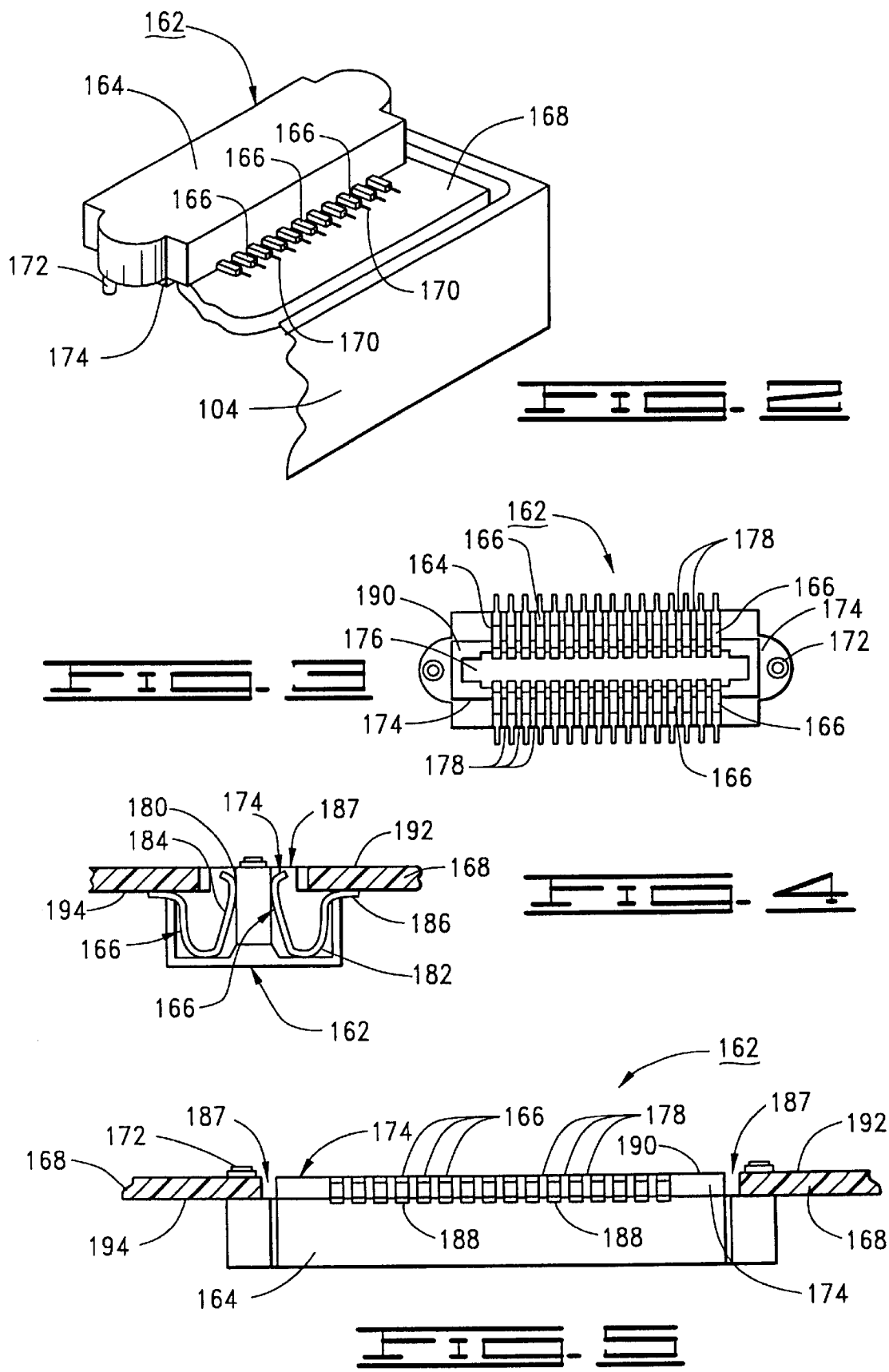

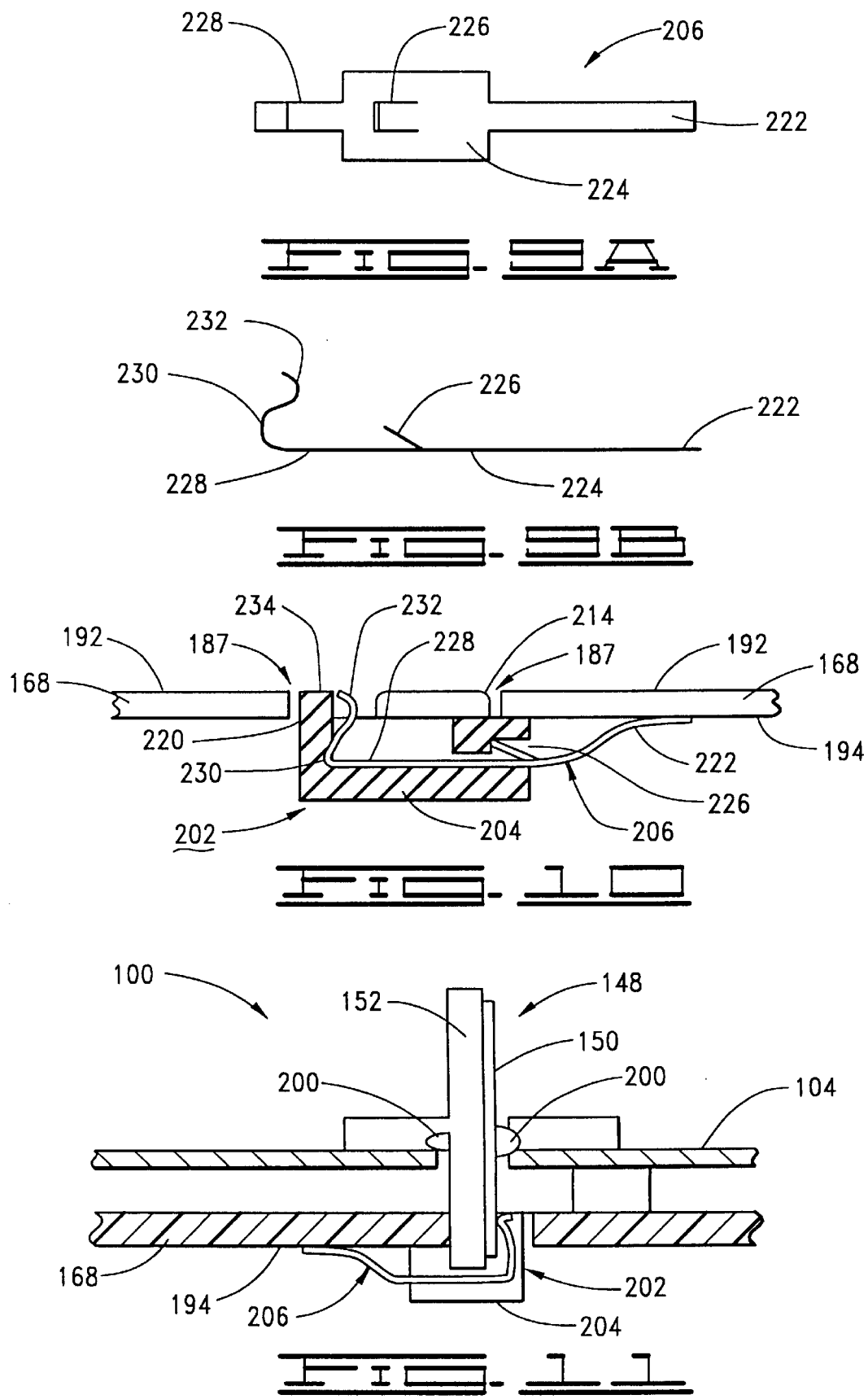

LOW INDUCTANCE FLEX-TO-PCB SPRING CONNECTOR FOR A DISC DRIVE

RELATED APPLICATIONS

This application is a continuation of U.S. patent application Ser. No. 09/303,202, now U.S. Pat. No. 6,129,579 filed Apr. 30, 1999 entitled LOW INDUCTANCE FLEX-TO-PCB SPRING CONNECTOR FOR A DISC DRIVE, which claims priority to Provisional Application No. 60/089,344 entitled LOW INDUCTANCE FLEX-TO-PCB SPRING CONNECTOR, filed Jun. 15, 1998 and Provisional Application No. 60/089,347 entitled HAD DATA FLEX EXIT SUPPORT AND SEAL, filed Jun. 15, 1998.

FIELD OF THE INVENTION

The present invention relates generally to the field of disc drive data storage devices, and more particularly but not by way of limitation, to a low inductance spring connector for connecting an actuator flex circuit of a disc drive to a printed circuit board of the disc drive.

BACKGROUND OF THE INVENTION

Modern disc drives are commonly used in a multitude of computer environments ranging from super computers through notebook computers to store large amounts of data in a form that can be made readily available to a user. Typically, a disc drive has one or more magnetic discs that are rotated by a spindle motor at a constant high speed. Each disc surface has a data recording surface divided into a series of generally concentric data tracks radially spaced across a band having an inner diameter and an outer diameter.

The data is stored within the data tracks on the disc in the form of magnetic flux transitions. The flux transitions are induced by an array of read/write heads. Typically, each data track is divided into a number of data sectors that store fixed sized data blocks.

The read/write head includes an interactive element such as a magnetic transducer that senses the magnetic transitions on a selected data track to read the data stored on the track. Alternatively, to write data to the disc surface, the read/write head transmits an electrically induced, short duration magnetic field that induces magnetic transitions on the selected data track.

Each read/write head is mounted to a load arm. Each load arm is supported by an actuator arm that is typically one of a plurality of members extending from an actuator cartridge-bearing member of an actuator assembly. The actuator assembly provides the rotary motion needed to selectively position the read/write head over a selected data track of the disc to either read data from or write data to the selected data track. The read/write head includes a slider assembly having an air-bearing surface that responds to an air bearing developed by the interaction of the read/write heads with a boundary layer of air. The boundary layer of air is developed by the rotation of the discs beneath the read/write heads. In response to the air bearing the read/write head flies adjacent the disc surface at a desired height thereby creating a gap between the read/write head and the surface of the corresponding disc.

Typically, a plurality of open-center discs and spacer rings are alternately stacked on a hub of the spindle motor. The hub, defining the core of the stack, serves to align the discs and spacer rings around a common axis. Collectively the discs, spacer rings, clamp ring and spindle motor hub define a disc pack. The read/write heads attached to the actuator assembly accesses the surfaces of the stacked discs.

In addition to the read/write heads the actuator assembly generally includes head wires, which conduct electrical signals from the read/write heads to a flex circuit that, in turn, conducts the electrical signals to a read channel located on the printed circuit board (PCB) of the disc drive. Normally the electrical signal paths are routed through one or more connectors en route to the read/write channel. The connectors facilitate the electrical connection between the flex circuit of the disc drive and the PCB of the disc drive. However in so doing, the contacts of the connectors typically induce an added inductance and capacitance into the circuit thereby causing a change in inductance and capacitance per unit length along the signal path. This change in inductance per unit length along the signal path frequently results in a parasitic electrical degradation of the signal. Several approaches have been used to accommodate the data signal interconnect needs of a disc drive, but in general, these approaches have been silent regarding resolution of parasitic electrical signal degradation problems caused by changes in inductance per unit length along the signal path.

In connecting the flex circuit and the PCB one previous approach makes use of an apparatus with a three connector combination configuration having a flex circuit component; a pass-through collector; and a printed circuit board connector. Under this scheme, the first primary component, the flex circuit connector (the connector body housing female connector pins), is soldered directly to the flex circuit. The second primary component, the pass-through connector having a connector body that houses male pins with a top portion protruding from a top side of the connector body and a bottom portion protruding from a bottom side of the connector body, is disposed adjacent the basedeck with the bottom portions of the male pins extending from an aperture or slot in the basedeck. The third primary component, the printed circuit board connector with a connector body housing female connector pins, is soldered directly onto the PCB. This approach has the advantage of confining the flex circuit internal to the HDA.

Under this three-connector combination approach the flex circuit connector is mounted to a flex circuit mounting bracket. Then the flex circuit connector connects to the pass-through connector internal to the HDA. Contact between the flex circuit connector and the pass-through connector is maintained by physically securing the flex circuit mounting bracket and the pass-through connector to the basedeck of the disc drive. External to the basedeck the pass-through connector connects to the printed circuit board connector. The printed circuit board connector is mounted to the PCB of the disc drive, and the PCB is then fastened to the basedeck of the disc drive. Attaching the PCB of the disc drive to the basedeck provides the means of maintaining physical contact between the pass-through connector and the printed circuit board connector.

Another approach of connecting a flex circuit to the disc drive PCB is to feed the flex circuit external to the HDA. Under this approach the flex circuit typically passes between the basedeck and a gasket mounted on the cover of the disc drive. Once the flex circuit is external to the HDA, the flex circuit commonly mates with a zero or low insertion force connector that is soldered to the PCB of the disc drive. The disadvantages of this external feed approach are exposure of the flex circuit to handling damage during the assembly process; customer installations, and in automated production processes. The production difficulties tend to arise when trying to locate, secure and connect the non-rigid flex circuit via automated means.

Normally, under this external feed approach, a flex circuit alignment member is secured directly to the flex circuit and a printed circuit board connector (a connector body housing female connector pins) is soldered directly to the PCB. The flex circuit is secured to an alignment member which lends support to the flex circuit and provides a means to maintain registration of the contact pads of the flex circuit in relation to the female connector pins or contact pads of the PCB. Additionally, the flex circuit is connected to the PCB external to the basedeck thereby exposing the flex circuit to potential damage. The PCB is then fastened to the disc drive basedeck to maintain stability of the connection. An example of an adaptation of this approach is disclosed by U.S. Pat. No. 5,403,202 to Donald P. Roehling ("Roelhling '202").

As is known, key factors that influence the choice of an interconnection solution to facilitate connection between the flex circuit and the disc drive PCB are quality; space constraints; mass production requirements; component costs; and component performance (for both mechanical and electrical characteristics). In historical perspective, with technology advances in the disc drive industry, one or more factors have dominated the decision process when electing an interconnection solution for a specific disc drive technology advancement. It is evident that the prominent key factor driving the signal interconnection technology invention in Roeliling '202 was the space constraint challenges presented by disc drives.

In contrast to the Roehiling '202 approach, the three-connector combination approach was driven by the desire to minimize the exposure of the flex circuit to handling and use damage while maximizing the interconnect configuration for automation. Under the three-connector combination approach the flex circuit is confined internal to the HDA of the disc drive, resolving the problem of exposing the flex circuit to handling and environmental damage, while use of the pass-through male pinned connector promotes ease of production.

Advancements in bit transfer rate technologies, with transfer rates in the range of one gigabit per second and the resultant pico-second range rise and fall signal time, have driven the interconnection electrical performance characteristics of the connection itself to be a key factor of read/write signal management. As bit transfer rates rise, negative effects on the integrity of the read/write signal, primarily parasitic electrical signal degradation due to changes in inductance per unit length along the signal path, begin to dominate as the key electrical performance factor to be addressed by read/write signal interconnection technology. As transfer rates approach the gigabit per second range, maintaining uniform inductance along the signal becomes the dominant key factor.

The signal management burdens within read/write signal interconnection technology, brought about by the emergence of transfer rates in the gigabit per second range, coupled with the remaining key factors of quality, mechanical performance, space constraints, automation considerations and component costs, have collectively converged to generate an unmet need in the industry for an improved flex-to-PCB connector that minimizes the parasitic electrical signal degradation effects created by changes in inductance and capacitance per unit length seen by the read/write signal along the signal path.

SUMMARY OF THE INVENTION

The present invention provides a low inductance electrical spring connector for interconnecting conductors of a flex circuit support and seal apparatus of a head-disc assembly of a disc drive to conductive traces on a printed circuit board of the disc drive. The electrical spring connector has a dielectric housing with a plurality of spaced apart raised insulator portions extending from the dielectric housing. The raised insulator portions and the dielectric housing form an open ended insertion cavity with the insulator portions and the dielectric housing forming the side walls and the dielectric, housing forming the bottom of the open ended insertion cavity. Conductive spring contacts are disposed between the raised insulator portions and supported by the dielectric housing, the conductive spring contacts having first and second ends extending from the dielectric housing. Each first end is solderable to a respective one of the conductive traces on the printed circuit board while each second end is a contact surface (such as 180) disposable adjacent the insertion cavity.

When the electrical spring connector is attached to the printed circuit board the insertion cavity is disposed below the head-disc assembly. Inserting the conductors of the flex circuit support and seal apparatus adjacent the contact surfaces into the insertion cavity enlists the contact surfaces to engage the conductors of the flex circuit support and seal apparatus to secure the flex circuit support and seal apparatus while providing electrical contact between the head-disc assembly and the printed circuit board.

The advantages and features of the present invention will be apparent from the following description when read in conjunction with the drawings and appended claims.

BRIEF DESCRIPTION OF THE DRAWINGS

FIG. 2 is a bottom perspective view of a low inductance flex-to-PCB electrical spring connector of the disc drive of FIG. 1 shown soldered to the disc drive PCB and basedeck.

FIG. 3 is a top view of the electrical spring connector of FIG. 2.

FIG. 4 is a cross-sectional view of the electrical spring connector of FIG. 3 shown together with a partial cut-away view of a printed circuit board of the disc drive of FIG. 1.

FIG. 5 is a side view of the electrical spring connector of FIG. 4.

FIG. 9A is a top view of a single sided compression contact of the electrical spring connector of FIG. 7.

FIG. 9B is a side view of the compression contact of FIG. 9A.

FIG. 10 is a cross-sectional view of the electrical spring connector of FIG. 7 mounted to the PCB.

FIG. 11 is a partially detailed side view of the electrical spring connector of FIG. 7 mounted to the PCB and showing the flex circuit engaged therewith.

DETAILED DESCRIPTION

Figure 1:
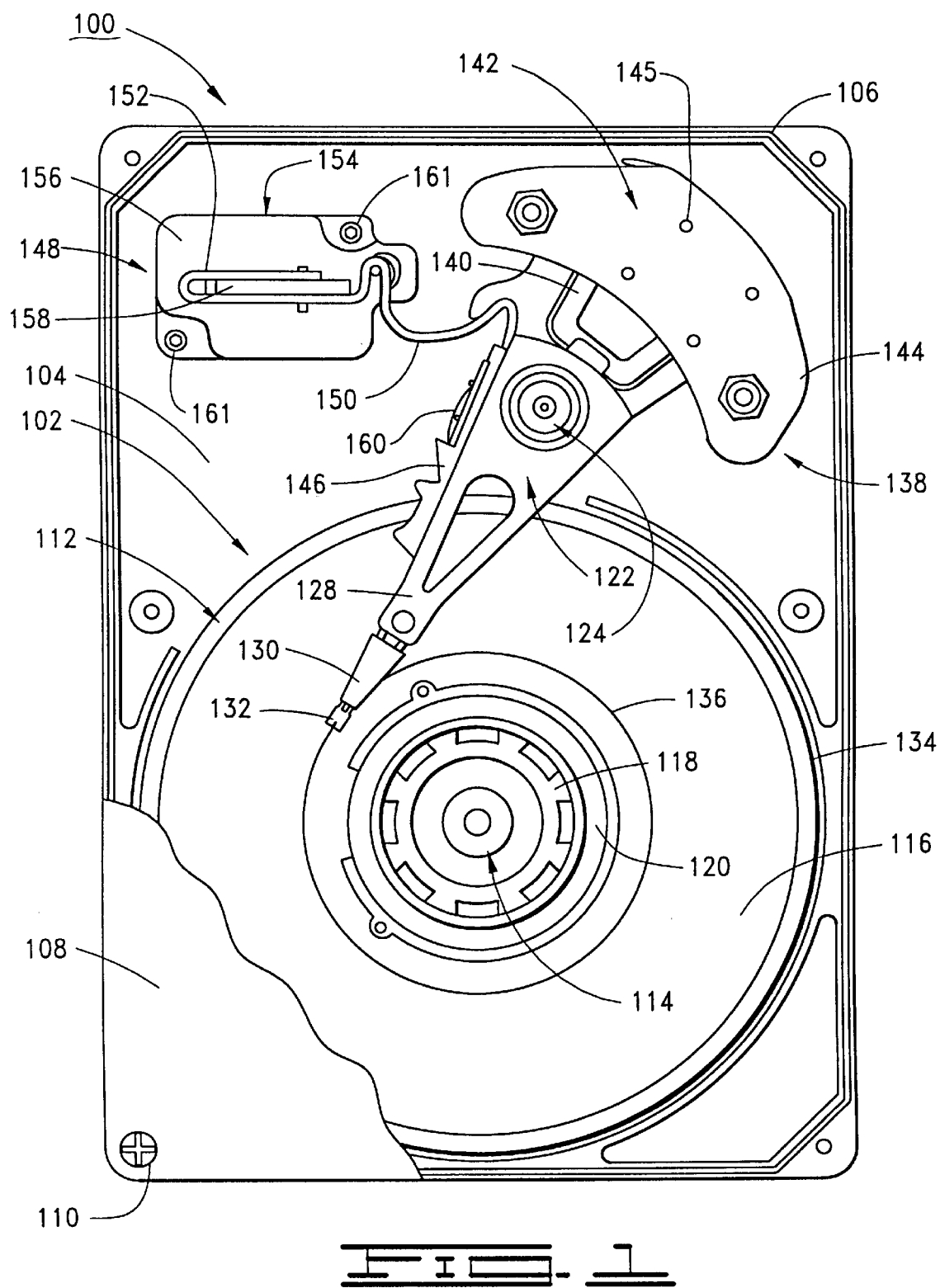
FIG. 1 is a top view of a disc drive constructed in accordance with the present invention.

Referring now to the drawings in general, and more particularly to FIG. 1, shown therein is a plan view of a disc drive 100 constructed in accordance with the present invention. The disc drive 100 includes a head disc assembly (HDA) 102, which includes a basedeck 104 to which various disc drive components are mounted, a gasket 106, a top cover 108 (partially cutaway), and fasteners 110. Together the basedeck 104, the gasket 106, the top cover 108 and the fasteners 110 (one shown) provide a top portion of a sealed internal environment for the HDA 102. It will be understood that numerous details of construction of the disc drive 100 are not included in the following description as such are well known to those skilled in the art and are believed to be unnecessary for the purpose of describing the present invention.

Mounted to the basedeck 104 is a disc pack assembly 112 having a spindle motor assembly 114 with a plurality of alternately stacked discs 116 and disc spacers (not shown) disposed about a spindle motor hub 118 and secured by a clamp ring 120. Adjacent the discs 116 is an actuator assembly 122 which pivots about a cartridge bearing assembly 124. The actuator assembly 122 has a centrally disposed E-block member (not separately designated) on which a plurality of actuator arms 128 (only one shown) are provided. Each actuator arm 128 supports a load arm assembly 130 which in turn supports a read/write lead 132 while each of the plurality of read/write heads 132 corresponds to a respective surface of one of the discs 116.

Each of the discs 116 has a data recording surface divided into concentric circular data tracks, (not shown), and the read/write heads 132 are positioned adjacent the data tracks to read data from, or write data to, the tracks. The data tracks collectively form a data portion on the disc surface. The data portion is constrained on its outer extremity by a guard band 134, and on its inner extremity by a landing zone 136.

The actuator assembly 122 of disc drive 100 is pivotally positioned by way of a voice coil motor assembly ("VCM") 138. The VCM 138 has an actuator coil assembly 140 immersed in the magnetic field generated by a magnet assembly 142. The magnet assembly 142 has a pair of opposing magnets (not shown) each supported by a pole piece 144. Thee pole piece 144 (constructed from magnetically permeable material such as steel) provides a flux path to complete the magnetic circuit of the VCM 138. The magnet assembly 142 is mounted between the basedeck 104 and the top cover 108 via screws and mounting apertures 145 located in the pole piece 144.

When controlled DC current is passed through the actuator coil assembly 140, an electromagnetic field is set up which interacts with the magnetic circuit of the VCM 138 to cause the actuator coil assembly 140 to move relative to the magnet assembly 142 in accordance with the well-known Lorentz relationship.

To provide the requisite electrical conduction paths between the read/write heads 132 and the disc drive read/write circuitry (not shown), read/write head wires (not separately shown) are routed on the actuator assembly 122. From the read/write heads 132 the read/write head wires run along the load arm assemblies 130, the actuator arms 128 to a flex stiffener 146 of a flex circuit support and seal apparatus 148. At the flex stiffener 146 the read/write head wires are soldered to corresponding conductive pads of a flex circuit 150 of the flex circuit support and seal apparatus 148.

The flex circuit support and seal apparatus 148 comprises the flex circuit 150 with a conductor portion 152, a rigid dielectric support bracket 154 with a base portion 156 and a connector portion 158 extending vertically from the base portion 156, a printed circuit board (PCB) 160 and the flex stiffener 146. The flex circuit support and seal apparatus 148 is connected to the basedeck 104 through the use of fasteners 161. Alternatively, the PCB 160 is eliminated where the functions thereof are incorporated elsewhere into the flex circuit 150.

The conductor portion 152 of the flex circuit 150 is secured by the connector portion 158 of the support bracket 154. The base portion 156 of the support bracket 154 provides an insertion slot (not shown) to allow passage of the conductor portion 152 between the base portion 156 and the connector portion 158. The basedeck 104 provides a slot (not shown in FIG. 2) to allow passage of the connector portion 158 with the adjacent conductor portion 152 of the flex circuit 150. The conductor portion 152 is disposed to engage a flex-to-PCB electrical spring connector 162 shown in FIG. 2. The base portion 156 of the support bracket 154 has mounting apertures (not shown) used in securing the flex circuit support and seal apparatus 148 to the basedeck 104 with the fasteners 161.

As shown in FIG. 2, the electrical spring connector 162 has a dielectric housing 164 for supporting and containing conductive spring contacts 166 that interconnect the HDA 102 to a disc drive printed circuit board (PCB) 168. The PCB 168 provides conductive traces 170 for conducting electrical signals to various components on the PCB 168. The conductive traces 170 can also be provided with solder pads (not shown) for soldering the electrical spring connector 162 to the PCB 168. In addition to housing the conductive spring contacts 166, the dielectric housing 164 provides a pair of strain relief containment pegs 172 for aligning and securing the dielectric housing 164 to the PCB 168 and a raised insertion cavity containment portion 174 enclosing an open ended insertion cavity 176 (shown in FIG. 3).

Continuing with FIG. 3, shown therein is a top view of the electrical spring connector 162 and the conductive spring contacts 166 disposed between a plurality of spaced apart raised insulator portions 178 extending from the dielectric housing 164. The spaced-apart insulator portions 178 prevent shorting of adjacent conductive spring contacts 166. Shown in FIG. 3 is the strain relief containment peg 172 and its positional relationship to the raised insertion cavity containment portion 174. Additionally, FIG. 3 shows the raised insertion cavity containment portion 174 surrounding the insertion cavity 176. The insertion cavity 176 is sized to accept the connector portion 158 of the support bracket 154 along with the accompanying conductor portion 152 of the flex circuit 150. Disposed between the conductive spring contacts 166 are the insulator portions 178. The insulator portions 178 secure the conductive spring contacts 166 to the dielectric housing 164 while preventing contact between adjacent conductive spring contacts 166. FIG. 4 shows the electrical spring connector 162 together with a partial cutaway view of the PCB 168 and opposing conductive spring contacts 166. Each conductive spring contact 166 has a contact surface 180; a "U"-shaped spring portion 182; a pre-load contact portion 184; and a tail portion 186. The tail portions 186 are disposed for soldering the conductive spring contacts 166 to the respective conductive traces 170 on the PCB 168. The U-shaped spring portions 182 provide a spring force dispensed by the contact surfaces 180 of the pre-load contact portions 184 when applying a positive compressive force against the conductor portion 152 of the flex circuit 150.

The contact surfaces 180 conform to, and press against, the conductor portion 152 of the flex circuit 150 to substantially form a continuous signal path of uniform electrical characteristics by maintaining uniformity in the inductance and capacitance of the signal path over the entire length of the signal path, thereby minimizing the parasitic electrical signal degradation effects created by changes in inductance and capacitance per unit length seen by the read/write signal along the signal path.

The PCB 168 has an insertion aperture 187 sized to accept the insertion cavity containment portion 174. The dielectric housing 164 has the pair of strain relief containment pegs 172 extending therefrom, and the PCB 168 provides corresponding containment apertures (not shown), the strain relief containment pegs 172 receivable in the containment apertures for aligning and securing the electrical spring connector 162 on the PCB 168.

The conductive spring contacts 166 of the electrical spring connector 162 are preferably made from a metal selected from the group consisting of phosphor bronze and beryllium copper. Additionally, the conductive spring contacts 166 preferably have a plating selected from the group consisting of tin, tin-lead and gold.

Shown in FIG. 5 is a side view of the electrical spring connector 162 including the plurality of spaced-apart insulator portions 178 extending from the dielectric housing 164 and disposed between the conductive spring contacts 166. The spaced apart raised insulator portions 178 and the dielectric housing 164 form a plurality of contact mounting channels 188 that, in conjunction with the raised insulator portions 178 confine and attach the conductive spring contacts 166 to the dielectric housing 164.

FIG. 5 shows the relationship between the raised insertion cavity containment portion 174 and the dielectric housing 164 of the electrical spring connector 162. The insertion cavity containment portion 174 protrudes through the insertion aperture 187 of the PCB 168 and supports the pre-load contact portions 184 of the conductive spring contacts 166 during conductive engagement with the conductor portion 152 of the flex circuit 150.

The dielectric housing 164 supports the tail portions 186 of the conductive spring contacts 166 in a uniform plane for soldering to the traces 170 of PCB 168. The insertion cavity containment portion 174 further has an upper surface 190 that is flush with a top surface 192 of the PCB 168 while the tail portions 186 of the conductive spring contacts 166 are soldered to the conductive traces 170 disposed on a bottom surface 194 of the PCB 168 once the electrical spring connector 162 is positioned on the PCB 168.

Figure 6:
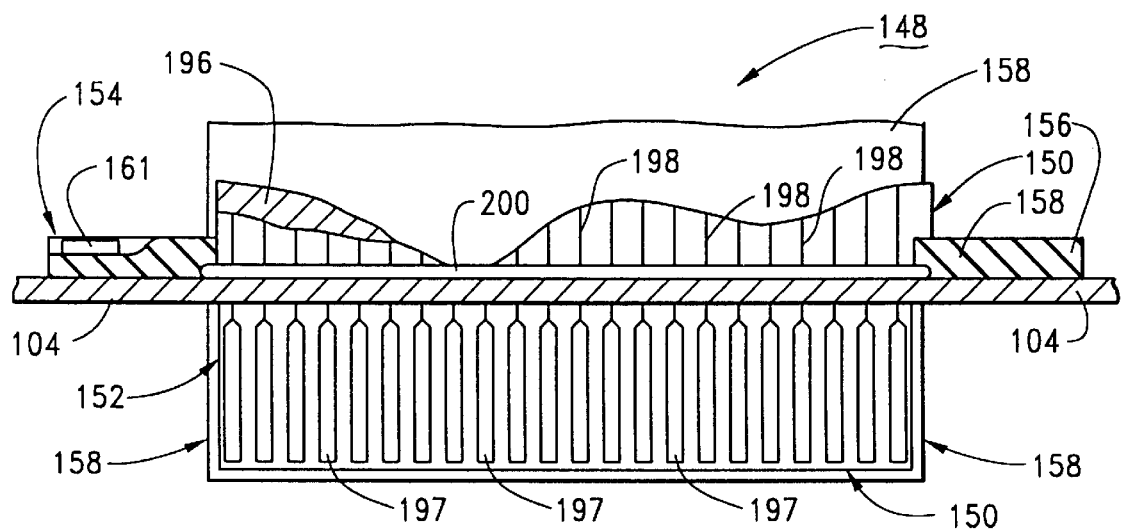
FIG. 6 is a partial cut-away, enlarged view of the flex circuit support and seal apparatus and the flex circuit of FIG. 1.

FIG. 6, a partial cut-away side view of the flex circuit support and seal apparatus 148, shows the connector portion 158 and the base portion 156 of the support bracket 154 along with the attached flex circuit 150 exposing a semi-flexible deformation resilient dielectric stiffener portion 196 that provides rigidity for the flex circuit 150 needed to support the spring force developed by contact surfaces 180 of the conductive spring contacts 166. FIG. 6 also shows conductors 197 electrically attached to a plurality of conductive traces 198 disposed on the flex circuit serve to electrically collect the conductors 197 of the flex circuit 150.

This connection provides a continuous signal path of uniform electrical characteristics by maintaining uniformity in inductance and capacitance of the signal path over the entire length of the signal path, thereby minimizing the parasitic electrical signal degradation effects created by changes in inductance and capacitance per unit length seen by the read/write signal along the signal path from the read/write heads 132 to the PCB 168.

The first ends of the read/write head wires are soldered or otherwise bonded to the read/write head 132 and second ends of the read/write head wires are soldered or bonded to conductive pads (not shown) of the conductive traces 198 of the flex circuit 150. The conductive pads are secured in place by the flex stiffener 146 while the PCB 168 attaches to the flex circuit 150. The conductor portion 152 of the flex circuit 150 is supported by the connector portion 158 of the support bracket 154 and together pass through the insertion slot 187 of the basedeck 104 and engage the conductive spring contacts 166 as extended into the insertion cavity 176 of the electrical spring connector 162. The conductive surfaces 180 secures the flex circuit support and seal apparatus 148 while providing electrical contact between the flex circuit support and seal apparatus 148 and the PCB 168.

That is, the conductors 197 and the conductor portion 152 of the flex circuit 150 together with the connector portion 158 of the support bracket 154 extend from the internal portion of the disc drive 100 through the basedeck 104 and together are inserted into the insertion cavity 176 of the electrical spring connector 162. The connector portion 158 engages an internal surface (not separately shown) of the dielectric housing 164 and the conductors 197 come to rest in electrical contact with the conductive surface 180 of the pre-load contact portion 184 of the conductive spring contacts 166. The pre-load contact portion 184 of each conductive spring contact 170 is in seamless connection with the U-shaped spring portions 182 of the conductive spring contact 170.

The conductors 197 of the flex circuit 150 form an electrical connection with respective conductive spring contacts 166. In addition to providing electrical connection between the flex circuit 150 and the PCB 168, the conductive spring contacts 166 develop a spring force that urge the conductors 197 of the flex circuit 150 against the connector portion 158 that in turn engages the insertion cavity 176, thereby providing the mechanical means of securing the flex circuit 150 position for maintaining the electrical connection made between the conductors 197 and the conductive spring contacts 166 while containing and securing the flex circuit support and seal apparatus 148.

FIG. 6 also shows a deformable resilient, compressible dielectric seal gasket 200 that engages the flex circuit 150, the support bracket 154 and the basedeck 104 to hermetically seal the bottom portion of the sealed internal environment for the HDA 102.

The conductors 197 are in electrical connection with the conductive traces 198 of the flex circuit 150 while attaching to the conductor portion 152 of the flex circuit 150 (FIG. 6). The conductive traces 198 continue along the length of the flex circuit 150 terminating at the conductive pads (not shown) which are secured by the flex stiffener 146 (FIG. 1). The PCB 160 attaches to the flex circuit 150 and is in electrical connection with conductive traces 198. The connector portion 158 of the support bracket 154 is in supportive contact with the conductor portion 152 of the flex circuit 150 and provides a rigid member to support the compressive load developed by the contact surface 180 of the spring contact 166 in operational contact with conductors 197. The support bracket 154 secures the flex circuit 150 while the dielectric seal gasket 200 encloses the flex circuit, 150 and the support bracket 154 to form the flex circuit support and seal apparatus 148.

The U-shaped spring portions 182 (FIG. 4) provide a spring force to the contact surfaces 180 of the pre-load contact portions 184 for applying a positive compressive force against the conductors 197 of the flex circuit support and seal apparatus 148 to secure the flex circuit support and seal apparatus 148 in place and to provide proper electrical contact is maintained between the conductors 197 of the flex circuit support and seal apparatus 148 and the contact surfaces 180 of the conductive spring contacts 166.

Figure 7:
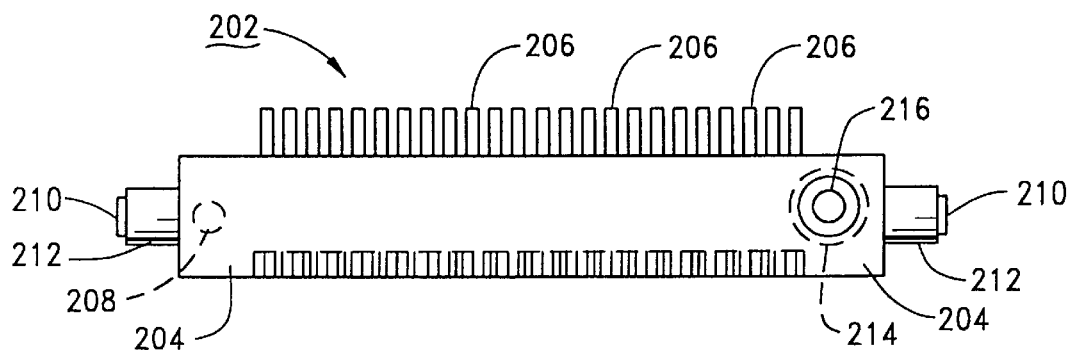
FIG. 7 is a bottom view of a second embodiment of a low inductance flex-to-PCB electrical spring connector constructed in accordance with the present invention.

FIG. 7 is a bottom view of a second embodiment of a single sided electrical spring connector 202 for the disc drive 100. The single sided electrical spring connector 202 has a dielectric housing 204, conductive spring contacts 206, an alignment peg 208, a pair of attachment tabs 210 (each having an attachment member 212), and a third attachment tab 214 enclosing a mounting aperture 216 for receiving a fastener (not shown).

The fastener extendible through the mounting aperture 216 of the third attachment tab 214 is used for attaching the single sided electrical spring connector 202 and the PCB 168 to the basedeck 104. The PCB 168 has a mounting aperture (not shown) corresponding to the mounting aperture 216 to allow the fastener to engage a containment aperture (not shown) of the basedeck 104, the containment aperture of the basedeck 104 corresponding to the mounting aperture 216.

The dielectric housing 204 supports and contains the conductive spring contacts 206 that interconnect conductors 197 of the flex circuit support and seal apparatus 148 to the conductive traces 170 on the PCB 168. The alignment peg 208 extending from the dielectric housing 204 is for aligning the dielectric housing 204 to the PCB 168 during the assembly process. The attachment tabs 210 extending from the dielectric housing 204 support the attachment members 212 which in turn attach the dielectric housing 204 to solder pads (not shown) of the PCB 168.

Figure 8:
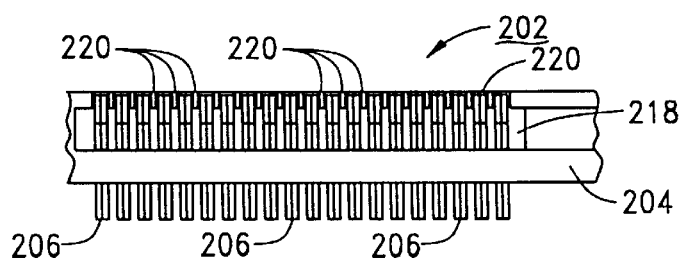
FIG. 8 is a partial cut-a-way top view of the electrical spring connector of FIG. 7.

FIG. 8 shows the dielectric housing 204 of the single sided electrical spring connector 202 surrounding an open ended insertion cavity 218 and supporting spaced apart raised insulator portions 220 that are disposed between the single sided conductive spring contacts 206. The spaced apart raised insulator portions 220 prevent shorting of adjacent single sided conductive spring contacts 206. The spaced-apart raised insulator portions 220 and the dielectric housing 204 form sidewalls (not separately shown) and the dielectric housing forms a bottom (not separately shown) of the open ended insertion cavity 218. The insertion cavity 218 is sized to accept the flex circuit support and seal apparatus 148, specifically tile connector portion 158 of the support bracket 154 along with the attached conductor portion 152 of the flex circuit 150 of the flex circuit support and seal apparatus 148.

The insertion cavity 218 of the single sided electrical spring connector 202 holds the flex circuit support and seal apparatus 148 in registration relative to the electrical spring connector 202 to insure proper contact is maintained between the conductors 197 of the flex circuit support and seal apparatus 148 and the conductive spring contacts 206.

FIG. 9A shows a top view while FIG. 9B shows a side view of the conductive spring contact 206 of the single sided electrical spring connector 202. The top view shows a tail portion 222, a main body portion 224, a retainer barb 226 extending from the main body portion 224, a contact base portion 228 while the side view shows a "C"-shaped pre-load contact portion 230; and a contact surface 232 relative to the retainer barb 226 to the contact base portion 228. The C-shaped pre-load contact portions 230 provide a spring force to the contact surfaces 232 for applying a positive compressive force against the conductors 197 (shown in FIG. 6) of the flex circuit support and seal apparatus 148 to establish electrical connections between the flex circuit support and seal apparatus 148 and the PCB 168.

Contact surfaces 232 conform to the conductors 197 to substantially form a continuous signal path of uniform electrical characteristics by maintaining uniformity in the capacitance and inductance of the signal path over the entire length of the signal path, thereby minimizing the parasitic electrical signal degradation effects created by changes in inductance per unit length seen by the read/write signal along the signal path.

The conductive spring contacts 206 of the single sided electrical spring connector 202 are made from metal selected from a group consisting of phosphor bronze and beryllium copper. Additionally, the conductive spring contacts 206 have a plating selected from a group consisting of tin, tin-lead and gold.

FIG. 10 is a cross-sectional view and partial cutaway of the single sided electrical spring connector 202 mounted on the PCB 168. The retainer barb 226 secures the conductive spring contacts 206 to the dielectric housing 204, the main body portion 224 (see FIG. 9) maintains the alignment of the conductive spring contacts 206 relative to the dielectric housing 204 while the base portion 218 controls the position of the "C"-shaped pre-load contact portion 230 relative to the main body portion 224. The tail portion 222 is formed to an "S"-shape prior to being soldered to conductive traces 170 disposed on the bottom surface 194 of the PCB 168 when the single sided electrical spring connector 202 is secured to the PCB 168.

The PCB 168 encloses an insertion aperture 187 sized to accept the raised insulator portions 220 and provide access clearance to the insertion cavity 228. The dielectric housing 204 has at least one attachment tab 214 extending therefrom, and the PCB 168 provides a corresponding alignment aperture (not shown), the attachment tab 214 is receivable in the alignment aperture of PCB 168 for aligning the single sided electrical spring connector 202 with the PCB 168.

Once the electrical spring connector 202 is secured to the PCB 168, the raised insulator portions 220 further have upper surfaces 234 that reside flush with the top surface 192 of the PCB 168 while the tail portions 222 of the conductive spring contacts 206 are soldered to conductive traces 194 disposed on the bottom surface 194 of the PCB 168.

FIG. 11 provides a cut-a-way side view of the basedeck 104 of the disc drive 100, the single sided electrical spring connector 202 soldered and attached to the PCB 168, the flex circuit support and seal apparatus 148 mounted to the basedeck 104 and plugged into the PCB 168 to form disc drive 100.

The electrical connection made between the conductive spring contacts 206 of the single sided electrical spring connector 202 and the conductors 197 of the flex circuit 150 of the flex circuit support and seal apparatus 148 substantially form a continuous signal path of uniform electrical characteristics by maintaining uniformity in the capacitance and inductance of the signal path over the entire length of the signal path, thereby minimizing the parasitic electrical signal degradation effects created by changes in inductance and capacitance per unit length seen by the read/write signal along the signal path.

The present invention provides a low inductance electrical spring connector (such as 162) for interconnecting the conductor portions (such as 152) of a flex circuit support and seal apparatus (such as 148) of a head-disc assembly (such as 102) of a disc drive (such as 100) to conductive traces (such as 170) on a printed circuit board (such as 168) of the disc drive. The electrical spring connector has a dielectric housing (such as 164) with a plurality of spaced apart insulator portions (such as 178) extending from the dielectric housing. The insulator portions and the dielectric Housing form an open ended insertion cavity (such as 176) with the insulator portions and the dielectric housing. Conductive spring contacts (such as 166) are disposed between the insulator portions and supported by the dielectric housing, the conductive spring contacts having first and second ends extending from the dielectric housing. Each first end (such as 186) is solderable to a respective one of the conductive traces on the printed circuit board while each second end is a contact surface (such as 180) disposable in the insertion cavity.

When the electrical spring connector is attached to the printed circuit board the insertion cavity is disposed below the head-disc assembly. Inserting the conductors of the flex circuit support and seal apparatus adjacent the contact surfaces into the insertion cavity enlists the contact surfaces to engage the conductors of the flex circuit support and seal apparatus to secure the flex circuit support and seal apparatus while providing electrical contact between the head-disc assembly and the printed circuit board.

It is clear that the present invention is well adapted to attain the ends and advantages mentioned as well as those inherent therein. While a presently preferred embodiment and a second embodiment of the invention have been described for purposes of the disclosure, it will be understood that numerous changes may be made which will readily suggest themselves to those of ordinary skill in the art and which are encompassed within the spirit of the invention disclosed and as defined in the appended claims.

What is claimed is:

1. An electrical spring connector interconnecting conductors of a flex circuit support and seal apparatus to conductive traces of a printed circuit board supported on a basedeck of a disc drive, the electrical spring connector comprising:
   a dielectric housing having a plurality of spaced apart insulator portions extending from the dielectric housing, the dielectric housing surrounding an open ended insertion cavity disposable below the basedeck; and
   a plurality of conductive spring contacts supported by the dielectric housing between the insulator portions, the conductive spring contacts having first ends extending from the dielectric housing and second ends confined within the dielectric housing, the first ends attachable to the conductive traces of the printed circuit board, the second ends of the conductive spring contacts being pre-load contact portions having contact surfaces disposable in the insertion cavity, the conductors of the flex circuit support and seal apparatus insertable adjacent the contact surfaces into the insertion cavity, the contact surfaces of the pre-load contact portions engaging the conductors of the flex circuit support and seal apparatus to secure the flex circuit support and seal apparatus while providing electrical contact between the flex circuit support and seal apparatus and the printed circuit board.

2. The electrical spring connector of claim 1 wherein the dielectric housing has at least one alignment peg extending therefrom, and wherein the printed circuit board has a corresponding alignment aperture, the alignment peg receivable in the alignment aperture for aligning the electrical spring connector on the printed circuit board.

3. The electrical spring connector of claim 1 wherein the basedeck has an insertion aperture, the flex circuit support and seal apparatus protruding through and extending from the basedeck and disposable in the insertion cavity of the dielectric housing, the flex circuit support and seal apparatus having a connector portion in supportive contact with a conductor portion insertable adjacent the contact surfaces of the pre-load contact portions of the conductive spring contacts into the insertion cavity of the dielectric housing, the contact surfaces engaging the conductors of the flex circuit support and seal apparatus to provide electrical contact between the flex circuit support and seal apparatus and the printed circuit board.

4. The electrical spring connector of claim 1 wherein the dialectric housing comprises at least one strain relief containment peg, and wherein the printed circuit board has a corresponding containment aperture, the strain relief containment peg receivable in the containment aperture for aligning the electrical spring connector on the printed circuit board.

5. The electrical spring connector of claim 4 further comprising a fastener which affixes the dielectric housing to the printed circuit board, wherein the fastener comprises an attachment member which extends from the dielectric housing, the attachment member solderable to the printed circuit board.

6. The electrical spring connector of claim 5 wherein each contact surface of the conductive spring contacts conforms to a respective one of the conductors of the flex circuit support and seal apparatus.

7. The electrical spring connector of claim 6 further comprises a support bracket having a connector portion for connecting the conductors of the conductor portion of flex circuit support and seal apparatus to the conductive spring contacts of the dielectric housing.

8. The electrical spring connector of claim 7 wherein the basedeck has an insertion cavity and wherein the flex circuit support and seal apparatus protrudes through the insertion cavity and extends into the insertion cavity of the dielectric housing, the flex circuit support and seal apparatus comprising a connector portion in supportive contact with a conductor portion insertable adjacent the contact surfaces of the pre-load contact portions of the conductive spring contacts into the insertion cavity of the dielectric housing, the contact surfaces engaging the conductors of the flex circuit support and seal apparatus to provide electrical contact between the flex circuit support and seal apparatus and the printed circuit board.

9. The electrical spring connector of claim 1 further comprising a fastener which affixes the dielectric housing to the printed circuit board, wherein the fastener comprises a first and a second attachment tab extensive from the dielectric housing, each attachment tab having an attachment member, the attachment members attaching the dielectric housing to the printed circuit board, and wherein the printed circuit board has respective first and second solder pads solderable to a respective one of the first and second attachment tabs for attaching the dielectric housing to the printed circuit board.

10. The electrical spring connector of claim 9 wherein the fastener further comprises a third attachment tab, the third attachment tab of the dielectric housing encloses a mounting aperture, wherein the printed circuit board has a corresponding mounting aperture and wherein the basedeck has a containment aperture corresponding to the mounting aperture of the printed circuit board, and a fastener extendable through the mounting aperture of each the dielectric housing and the printed circuit communicating with the containment aperture of the basedeck for attaching the dielectric housing to the printed circuit board and to the basedeck.

11. A disc drive, comprising:

a head-disc assembly comprising a housing which forms an enclosure for a rotatable disc, an actuator assembly which supports a head adjacent the disc, and a flex circuit support and seal apparatus comprising a flex circuit which is affixed to the actuator assembly and routed through a housing aperture in the housing; and a printed circuit board affixed to an exterior surface of the housing and having a printed circuit board aperture aligned with the housing aperture, the printed circuit board comprising conductive traces for conducting electrical signals to various electrical components supported by the printed circuit board components, the printed circuit board further comprising an electrical spring connector which interconnects conductors of the flex circuit to the conductive traces of the printed circuit board, the electrical spring connector comprising:

a dielectric housing which is affixed to the printed circuit board and which spans the printed circuit board aperture, the dielectric housing comprising a plurality of spaced apart insulator portions extending from the dielectric housing; and a plurality of conductive spring contacts supported by the dielectric housing, each conductive spring contact having a tail portion, a main body portion and a pre-load contact portion with a contact surface, each tail portion affixable to a respective one of the conductive traces on the printed circuit board, each contact surface of the pre-load contact portions extending between an adjacent pair of the spaced apart insulator portions to establish electrical contact between a respective one of the conductors of the flex circuit and the printed circuit board.

12. The disc drive of claim 11 wherein the electrical spring connector further comprises a fastener which fastens the dielectric housing to the printed circuit board.

13. The disc drive of claim 12 wherein the electrical spring connector further comprises a strain relief containment peg extensive from the dielectric housing and wherein the printed circuit board has a corresponding containment aperture, the strain relief containment peg receivable in the containment aperture for aligning and securing the electrical spring connector on the printed circuit board.

* * * * *